United States Patent
Hughes et al.

(10) Patent No.: US 11,724,622 B2
(45) Date of Patent: Aug. 15, 2023

(54) BATTERY PACK MULTI-CELL STATE ESTIMATION

(71) Applicant: Ford Global Technologies, LLC, Dearborn, MI (US)

(72) Inventors: Justin T. Hughes, Allen Park, MI (US); Marcelo Araujo Xavier, Belleville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 169 days.

(21) Appl. No.: 17/399,660

(22) Filed: Aug. 11, 2021

(65) Prior Publication Data

US 2023/0048157 A1 Feb. 16, 2023

(51) Int. Cl.
  *H02J 7/00* (2006.01)
  *B60L 58/22* (2019.01)
  *B60L 50/64* (2019.01)
  *B60L 58/12* (2019.01)

(52) U.S. Cl.
  CPC ............... *B60L 58/22* (2019.02); *B60L 50/64* (2019.02); *B60L 58/12* (2019.02); *H02J 7/0014* (2013.01); *H02J 7/0048* (2020.01)

(58) Field of Classification Search
  CPC .......... B60L 58/12; B60L 58/22; B60L 50/64; H02J 7/0014; H02J 7/0048
  USPC ............................................ 320/109; 701/22
  See application file for complete search history.

(56) References Cited

U.S. PATENT DOCUMENTS

| 9,718,455 | B2 | 8/2017 | Yu et al. |
| 2017/0242077 | A1* | 8/2017 | Guo ...................... H01M 10/48 |
| 2019/0339333 | A1* | 11/2019 | Gelso ................. G01R 31/3835 |
| 2020/0182937 | A1* | 6/2020 | Wampler, II .............. B60L 3/12 |

FOREIGN PATENT DOCUMENTS

CA 2588334 C 6/2006

OTHER PUBLICATIONS

T. Kim, C. Lee, J. J. Ochoa, H. Lee, K. Kim and J. -H. Park, "Hybrid Bar-Delta Filter-Based Health Monitoring for Multicell Lithium-Ion Batteries using an Internal Short-Circuit Cell Model," 2021 IEEE 12th International Symposium on Power Electronics for Distributed Generation Systems (PEDG) (Year: 2021).*
Gregory L. Plett, "Efficient Battery Pack State Estimation Using Bar-Delta Filtering", EVS24, Stavanger, Norway, May 13-16, 2009, pp. 1-8.
Haifeng Dai et al., "Online Cell SOC Estimation of Li-ion Battery Packs Using a Dual Time-Scale Kalman Filtering for EV Applications", Applied Energy 95 (2012), pp. 227-237.
(Continued)

*Primary Examiner* — Zixuan Zhou
(74) *Attorney, Agent, or Firm* — David B. Kelley; Brooks Kushman P.C.

(57) ABSTRACT

A controller discharges a traction battery according to power limits defined by output that is indicative of a state of charge of the traction battery and is updated by a bar delta filter according to a balancing current. The balancing current is associated with each cell of a string of series connected cells of the traction battery and represents a deviation of an estimated current through the cell from a total current of the string.

18 Claims, 2 Drawing Sheets

(56) References Cited

OTHER PUBLICATIONS

Yuejiu Zheng et al., "Cell State-of-Charge Inconsistency Estimation for LiFePO4 Battery Pack in Hybrid Electric Vehicles Using Mean-Difference Model", Applied Energy 111 (2013), pp. 571-580.
Fengchun Sun et al., "A Novel Dual-Scale Cell State-of-Charge Estimation Approach for Series-Connected Battery Pack Used in Electric Vehicles", Journal of Power Sources 274 (2015), pp. 582-594.

* cited by examiner

BATTERY PACK MULTI-CELL STATE ESTIMATION

TECHNICAL FIELD

The present disclosure relates to the monitoring of electrical parameters of a vehicle battery.

BACKGROUND

Some vehicles use batteries as an energy source for propulsion. In electric vehicles, estimation of maximum travel is generally a function of system efficiency, remaining useful energy, and battery state of charge (SOC). However, maximum travel based on such may only be accurate in ideal conditions. Another estimation is the available power, also known as power capability, or state of power (SOP). This estimate quantifies the amount of power one can either insert (charge) or extract (discharge) from the battery within a given time horizon. Accurate estimates of battery SOC and SOP rely on the capability of estimating these quantities at the cell-level, and while many electric vehicles estimate both the SOP and SOC of the battery pack, they may lack the necessary insights from the battery cell.

SUMMARY

One embodiment is an automotive battery system. The battery system comprises a traction battery and a controller. The traction battery includes a string of series connected cells. The controller is programmed to implement a bar delta filter. The bar delta filter is configured to update output indicative of a state of charge of the traction battery from a model of the traction battery according to a balancing current associated with each of the cells that represent a deviation of an estimated current through the cell from a total current of the string. The controller is further programmed to one of charge and discharge the battery according to the power limits defined by the updated output.

A method includes updating, via a bar delta filter, output indicative of a state of charge of a traction battery from a model of the traction battery according to a balancing current associated with each cell of the traction battery that represents a deviation of an estimated current through the cell from a total current of a string of the cells, and discharging (or charging) the traction battery according to power limits defined by the updated output.

An automotive control system has a controller that charges or discharges a traction battery according to power limits defined by output indicative of a state of charge of the traction battery and updated by a bar delta filter according to a balancing current associated with each cell of a string of series connected cells of the traction battery and that represents a deviation of an estimated current through the cell from a total current of the string.

DETAILED DESCRIPTION

Figure 1:
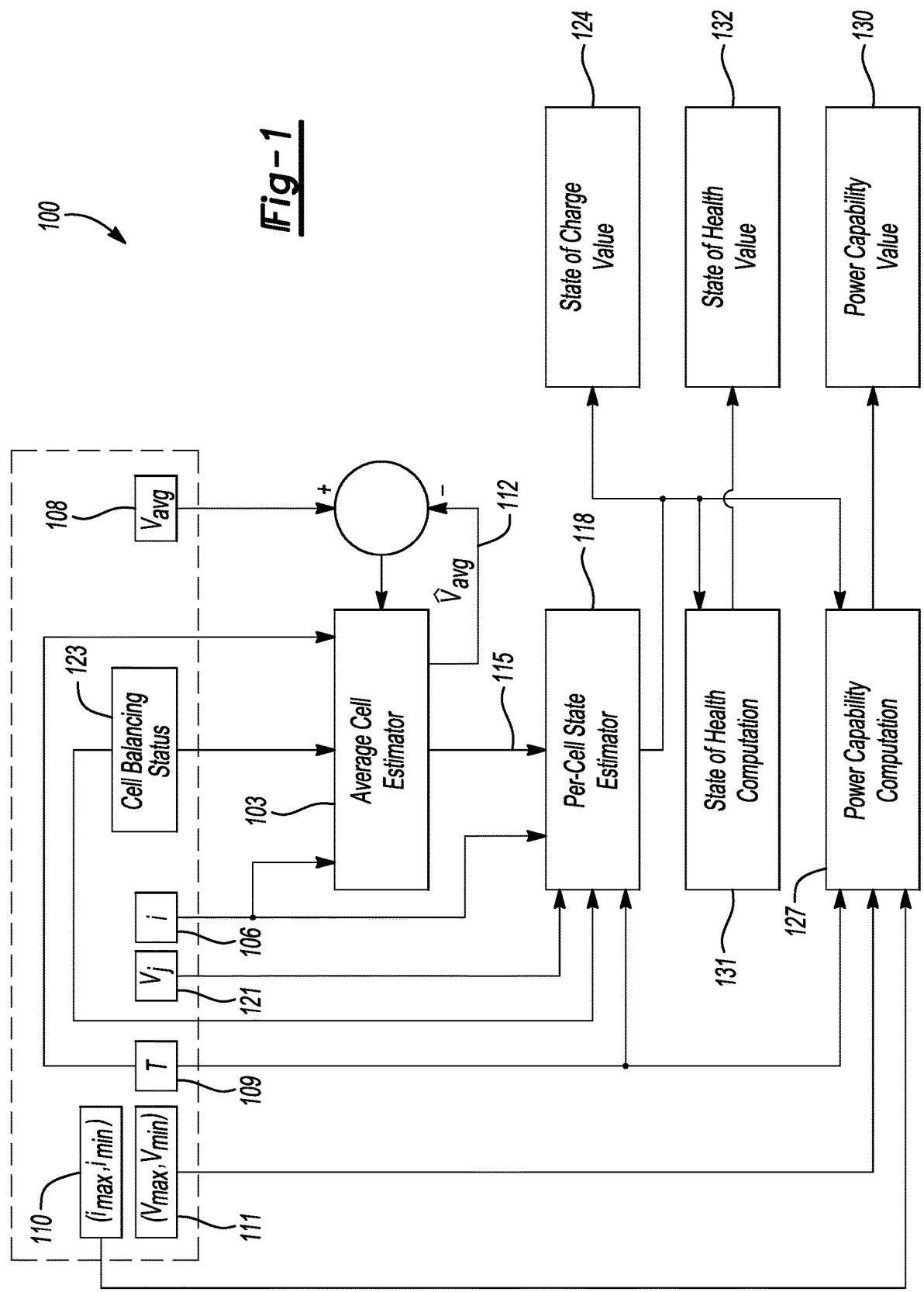
FIG. 1 illustrates a battery parameter estimation scheme.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

In general, a vehicle battery may be used to provide torque to a propulsion system within a vehicle. The vehicle battery may be a traction battery. The vehicle battery may be used to store electrical energy. Further, the vehicle battery may be used to convert the stored electrical energy into mechanical energy to propel the vehicle. In some embodiments, the battery may be modeled to have a first RC circuit and a second RC circuit. The battery may have a first capacitor corresponding with the first RC circuit, and a second capacitor corresponding with the second RC circuit.

The vehicle battery may comprise a plurality of battery segments. A battery segment may be at least partially defined by a battery cell. As such, the vehicle battery may include a plurality of battery cells. In some embodiments, at least two of the battery cells of the plurality of battery cells are in series. In such embodiments, the electrical potential of both of the battery cells may be summed. Alternatively, or additionally, at least two of the battery cells of the plurality of battery cells are in parallel. In such embodiments, the electrical current may be summed. The vehicle battery may have a plurality of sensors. One of the sensors may determine and provide measures pertaining to the battery to a vehicle controller, such as input current, voltage, and temperature. Additionally, or alternatively, a battery segment may be at least partially defined by an array of battery cells. An array may be a grouping of battery cells. An array may comprise battery cells disposed at least one of in series to another battery cell, or parallel to another battery cell. In some embodiments, the vehicle may have a plurality of battery arrays.

The vehicle battery may be disposed in a vehicle power network. The power network may be configured to facilitate the electrical communication between power electronics within a vehicle. The power network may use a plurality of electrical bus networks to facilitate the communication. One of the electrical bus networks may be a high-voltage bus network. The high-voltage bus network may be configured to provide DC electricity to electrical components requiring a high voltage. For example, the high-voltage bus network may be configured to have an electrical potential difference of 500 volts. The high-voltage bus network may be configured to be in direct electrical communication with a vehicle battery. Another of the electrical bus networks may be a low-voltage bus network. The low-voltage bus network may be configured to provide DC electricity to electrical components requiring a low voltage. For example, the low-voltage bus network may be configured to have an electrical potential difference of 12 volts. The low-voltage bus network may be in direct electrical communication with a supplementary battery. The power network may have a converter. The converter may be configured to convert electricity of a first set of electrical parameters into a second set of electrical parameters. For example, the converter may be configured to convert electricity having 500 volts into electricity having 12 volts. The power network may include a common ground. The ground may be configured to act as a source of low electrical potential to facilitate the flow of electrical current. In some embodiments, the high-voltage bus network shares a common ground with the low-voltage bus network. Alternatively, the power network may have a plurality of electrical grounds.

The power network may further comprise a plurality of electrical parameter sensors. The plurality of electrical parameter sensors may be in electrical communication with the vehicle battery. The plurality of electrical parameter sensors may be configured to determine the electrical parameters of a battery segment. For example, an electrical parameter sensor may be configured to determine an electrical parameter of a battery cell. The plurality of electrical parameter sensors may be configured to determine one of electrical potential, electrical current, capacitance, inductance, electrical phase, or frequency, among others. Determinations from the plurality of electrical parameter sensors may be used by controller to determine other electrical parameters of the power network. For example, a controller may use an electrical potential determination and an electrical current determination to estimate the electrical power within the power network.

The controller may have a memory system and a processor. The memory system may be configured to store instruction sets such as programs, algorithms, methods, etc. The memory system may be further configured to receive, monitor, and store values presented to the controller. Further, the memory may serve as a database. As such, the memory may create, store, and edit data stored in the database. The database may define a schedule. Alternatively, or additionally, the database may define a plurality of schedules. A schedule may include entries used as reference for operating a device. The processor may be configured to execute instruction sets. The controller may be configured to receive signals indicative of information from external sources including but not limited to sensors, devices, and other controllers. The controller may be configured to receive information by various ways including electrical communication and electrical-magnetic communication. Further, the vehicle may comprise a plurality of controllers.

The controller may be a vehicle controller. As such, the controller may be in communication with an engine, a vehicle battery, a drivetrain, an exhaust system, a generator, and a motor of a vehicle. The controller may further be in communication with braking systems, including a regenerative braking system and a friction braking system. The controller may be configured to retrieve values from each of the components of a vehicle such as engine speed, battery state of charge, vehicle torque, exhaust flow, and the conditions of a vehicle power network.

FIG. 1 illustrates a battery parameter estimation scheme 100. The battery cell estimation algorithm 100 may include a plurality of subroutines. The battery cell estimation algorithm 100 may have an average cell estimation routine 103 and a target cell estimation routine 118.

The average cell estimation routine 103 may be partially comprised of a Kalman filter algorithm. The average cell estimation routine 103 may be configured to receive a battery pack current value 106 and a battery temperature 109 value. The average cell estimation routine 103 may use one of the battery pack current value 106 and the battery temperature 109 value to calculate an average cell voltage value 121 and an average cell state vector 115. To calculate the average cell voltage value 121 and average cell state vector 115, the average cell estimation routine 103 may employ a bar filter function. In addition to the battery pack current value 106 and battery temperature 109 value, the bar filter function may use the average state of charge of the battery, the average polarization voltage of the battery cells, the hysteresis voltage of the battery pack, the average cell resistance, the battery pack capacity, and the bias of electrical parameter sensors.

The average cell estimation routine 103 may be configured to receive one of a battery current value 106 (i), a current bias value ($i_b$), a balancing current value ($i_{bal}$), an adjusted battery current value, ($i_a$), a number of cells in a battery pack (N), an average cell voltage value 108 ($v_{avg}$), a battery pack open circuit voltage value (OCV), average cell polarization voltage values ($\bar{v}_{c_1}, \bar{v}_{c_2}$), an average battery cell state of charge ($\bar{z}$), an average cell internal resistance value ($\bar{r}_0$), and a noise term ($\omega$), which accounts for other unmodeled disturbances.

The average cell estimation routine 103 determines an estimated voltage 112. The estimated voltage may be subtracted from the provided average voltage resulting in an estimation error which is provided to the average cell estimation routine 103. As such, the estimated voltage may function as a feedback loop with the provided average voltage and the average cell estimation routine 103. In such cases, the average cell estimation routine 103 may use the following expressions to determine the estimated voltage ($\hat{v}_{avg}$):

$$\hat{v}_{avg} = OCV(\bar{z}) - (\bar{v}_{c_1} + \bar{v}_{c_2} + \bar{r}_0 * i_a)$$

$$i_a = i + \frac{1}{N}\sum_j i_{bal}^j - i_b$$

Here, it is shown that the estimated voltage may be determined by reducing the battery pack open-circuit voltage value by the sum of the voltages across the internal capacitors, and the product of the battery internal resistance value and the adjusted battery current value 106. It is also shown that the adjusted battery current value 106 may be determined by reducing the sum of the battery current value 106 and the average call balancing current value by the bias current value. The estimated voltage value may be reduced from the average cell voltage value 121 and returned to the average cell estimation routine 103 to determine the average cell voltage value 121 more accurately.

The average cell estimation routine 103 may be configured to determine an average cell state vector 115. The average cell state vector 115 may be comprised of a plurality of capacitor voltage components, a battery state of charge component, a battery internal resistance component, and a bias current component as shown below:

$$\hat{x} = [\bar{v}_{c_1} \bar{v}_{c_2} \bar{z} \bar{r}_0 i_b]^T$$

Each component may be configured to start with a predetermined value at the start of the average cell estimation routine. Additionally, each component of the average cell state vector 115 may be updated by a corresponding equation. For example, an updated component corresponding to the voltage across the first internal battery capacitor may be resolved by the following equation, where $\tau_1$ is the time constant associated with the first RC pair and $c_1$ is the capacitance of first internal battery capacitor:

$$\nabla_{c_1 k+1} = \left(1 - \frac{\Delta t}{\tau_1}\right)\nabla_{c_1 k} + \frac{\Delta t}{c_1} * i_a + \omega_{\overline{v}_{c_1}}$$

An example of an update to the battery state of charge component may be provided by the following equation, where Δt is the time between iterations of the bar filter:

$$\overline{z}_{k+1} = \overline{z}_k + (-\Delta t)\frac{i_a}{Q} + \omega_{\overline{z}_1}$$

The target cell estimation routine 118 may be configured to produce a cell state of charge value 124. To produce the cell state of charge value 124, the target cell estimation routine 118 may be configured to receive the battery temperature 109, the average cell voltage value 121, the battery pack current value 106, and the average cell state vector 115. Even further, the target cell estimation routine 118 may be configured to receive the cell status 123, which is indicative of historical performance and parameters of each battery cell. The state vector for cell j at time step m, $\hat{x}_m^j$, may be comprised of a cell state of charge component, $\overline{z}_m + \Delta z_k^j$, a cell internal resistance component, $\overline{r_{0_m}} + \Delta r_{0_k}^j$, and a cell capacity component, $Q + \Delta Q_k^j$, as shown below:

$$\hat{x}_m^j = [\overline{z}_m + \Delta z_k^j \, \overline{r_{0_m}} + \Delta r_{0_k}^j \, Q + \Delta Q_k^j]^T$$

As shown, each component within the cell state vector contains a delta portion. Each delta portion may be configured to start with a predetermined value at the start of the target cell estimation routine 103. Each delta portion may be updated with a time step $\Delta t_\Delta$ which may be different than Δt. Additionally, each delta portion may be updated by a corresponding equation. The battery state of charge delta portion may be updated by the following equation:

$$\Delta z_k^j = -\Delta t_\Delta * \left(\frac{i - i_b + i_{bal}^j}{Q + \Delta Q_{k-1}^j} - \frac{i - i_b + \frac{1}{N}\sum_{lj} i_{bal}^j}{Q}\right) + \omega_{\Delta z}$$

The target cell estimation routine 118 may be configured to produce a cell voltage estimation value for each battery cell. The target cell estimation routine 118 may be determined by the following equation:

$$\hat{v}_j = OCV(z + \Delta z^j) - \overline{v}_{c_1} - \overline{v}_{c_2} - (\overline{r}_0 + \Delta r_0^j)*(i - i_b + i_{bal}^j)$$

The battery cell estimation algorithm may comprise a state of health computation routine 131. The state of health computation routine 131 may be configured to receive the cell voltage estimation value produced by the target cell estimation routine 118. The state of health computation 131 may be configured to produce a state of health value 132. The state of health value 132 may include an evaluation of cells within the vehicle battery. For example, the state of health value 132 may include a differential value of individual cell minimum and maximum voltage and current values. Additionally, or alternately, the state of health value 132 may include an overall battery health evaluation. As such, the state of health value 132 may have access to battery historical values.

The battery cell estimation algorithm may comprise a power computation routine 127. The power computation routine 127 may be used to determine an accurate amount of power the vehicle battery can dispense or receive. In making the determination, the power computation routine 127 may rely on a current range vector 110 and voltage range vector 111. The current range vector 110 may comprise the maximum current value of one of the plurality of cells and the minimum current value of one of the plurality of cells. Similarly, the voltage range vector 111 may comprise the maximum voltage value of one of the plurality of cells and the minimum voltage value of one of the plurality of cells. The power computation routine 127 may be configured to receive the cell state of charge value 124. The power computation routine 127 may be configured to execute one of a plurality of subroutines. The power computation routine 127 may be configured to execute one of a simple subroutine, an underestimate subroutine, and a complex subroutine. Additionally, the battery cell estimation algorithm may comprise a power value function 130. The power value function 130 may be used within at least one of the simple subroutine, the overestimate subroutine, the underestimate subroutine, and the complex subroutine. The power value function 130 may be used to determine a power value. The power value function 130 may be used on a single cell or a plurality of cells. The power value function 130 may determine the power value by multiplying the electrical current capability of a cell or plurality of cells by the electrical potential of the cell or plurality of cells. The power value function 130 may be configured to receive an electrical current capability value of a cell or plurality of cells. The battery cell estimation algorithm may be configured to receive a command from a vehicle controller to selectively execute one of the plurality of subroutines based on the electrical parameters of the vehicle battery.

Figure 2:
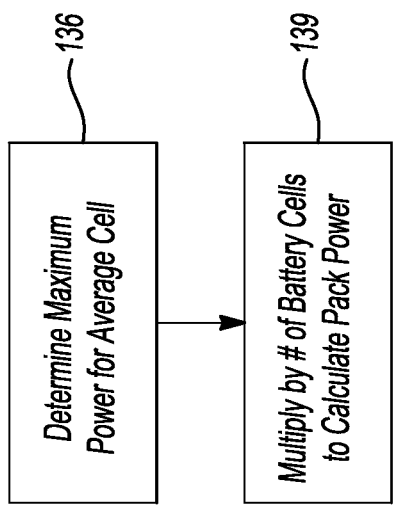
FIG. 2 illustrates a power estimation algorithm.

FIG. 2 illustrates a power estimation algorithm. The simple subroutine may be defined by a plurality of steps. A first power step 136 may be to determine the maximum power of the average cell. The next power step 139 may be to multiply this value by the number of cells within the vehicle battery to calculate pack power.

Figure 3:
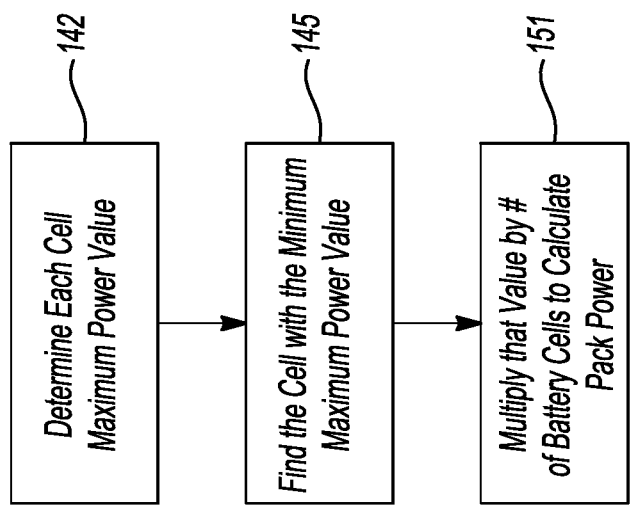
FIG. 3 illustrates an underestimate power estimation algorithm.

FIG. 3 illustrates an underestimate power estimation algorithm. The underestimate subroutine may be comprised of a plurality of steps. A first underestimate step 142 may be to determine each cell's maximum power value using the power value function 130. The second underestimate step 145 may be to find the cell with the smallest (minimum) maximum power value. Finally, the last underestimate step 151 may be to multiply the smallest of the maximum power values by the number of cells in the plurality of cells to calculate the pack power.

Figure 4:
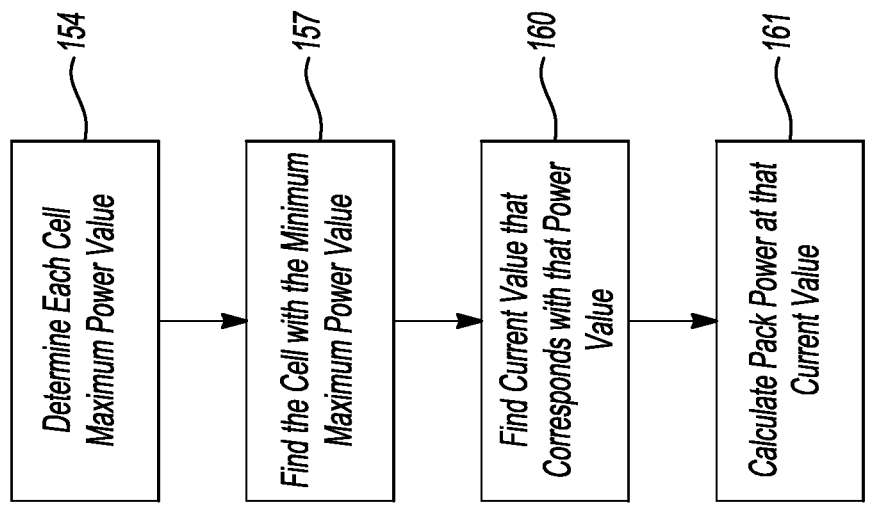
FIG. 4 illustrates a complex power estimation algorithm.

FIG. 4 illustrates a complex power estimation algorithm. The complex subroutine may be comprised of a plurality of steps. A first complex step 154 may be to determine the maximum power value for each cell. A second complex step 157 may be to find the cells correlating to the maximum power value and the minimum power value. In this step, the power value function 130 may be configured to determine the maximum power of each cell based on the determined maximum power value instead of the cell's current capability value. A third complex step 160 may be to find the current value that corresponds with the determined power value. The current value may vary based on the SOC of the battery. A fourth complex step 161 may be to calculate the pack power based on the electrical current value.

In one embodiment, one of the three different algorithms could be selected for constant use. Additionally, or alternatively, multiple algorithms of the three different algorithms may be in use throughout the course of travel depending on battery SOC, cell imbalance, etc.

After the completion of this algorithm, the vehicle may apply a driving schedule to the propulsion system of a vehicle. In particular, the vehicle battery may be discharged, or charged, according to the power limits of the corresponding power estimation algorithm. In some embodiments, this may improve the power usage of the vehicle. In other embodiments, application of the power estimation algorithm may improve vehicle performance. In one example, the vehicle controller may be configured to determine the total power required to propel the vehicle at a desired acceleration. In such an embodiment the controller may be configured to apply a power adjustment schedule to a vehicle input. The vehicle input may be an acceleration pedal. The power adjustment schedule may be comprised of desired torque entries, accelerator pedal positions, and battery power entries. In some embodiments, the desired torque entries may be partially dependent upon accelerator pedal positions and battery power entries. As such, the controller may be configured to update output power of the vehicle battery in response to changes in the battery power capability based on the power adjustment schedule.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. Generating power limits based on state of charge data, for example, can be done using conventional techniques known in the art. And charging or discharging a traction battery according to such limit means, for example, that power associated with the charging or discharging would not exceed or fall below the limits established.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An automotive battery system comprising:
a traction battery including a string of series connected cells; and
a controller programmed to
implement a bar delta filter configured to update output indicative of a state of charge of the traction battery from a model of the traction battery according to a balancing current associated with each of the cells that represents a deviation of an estimated current through the cell from a total current of the string, and
one of charge and discharge the traction battery according to power limits at least partially defined by the updated output.

2. The automotive battery system of claim 1, wherein the update includes a comparison of a measured average voltage of the string and an estimated average voltage of the string from the model, and wherein responsive to a difference between the measured average voltage and the estimated average voltage, update parameters of a bar filter portion of the bar delta filter according to the difference.

3. The automotive battery system of claim 2, wherein the update includes a comparison of a measured voltage of one of the cells and an estimated voltage of the one of the cells from the model, and wherein responsive to a difference between the measured voltage and the estimated voltage, update parameters of a delta filter portion of the bar delta filter according to the difference.

4. The automotive battery system of claim 3, wherein the estimated voltage depends on output of the bar filter portion.

5. The automotive battery system of claim 1, wherein each of the cells has a corresponding delta filter portion associated therewith.

6. The automotive battery system of claim 1, wherein a current input to the bar delta filter includes an average balancing value that represents an average deviation of the estimated current through the cells from a total current of the string.

7. The automotive battery system of claim 1, wherein a current input to the bar delta filter includes delta balancing values that represent, for each of the cells, a deviation of the estimated current through the cell from a total current of the string.

8. A method comprising:
updating, via a bar delta filter, output indicative of a state of charge of a traction battery from a model of the traction battery according to a balancing current associated with each cell of the traction battery that represents a deviation of an estimated current through the cell from a total current of a string of the cells, and
charging or discharging the traction battery according to power limits at least partially defined by the updated output.

9. The method of claim 8, wherein the updating includes comparing a measured average voltage of the string and an estimated average voltage of the string from the model, and responsive to a difference between the measured average voltage and the estimated average voltage, updating parameters of a bar filter portion of the bar delta filter according to the difference.

10. The method of claim 9, wherein the updating includes comparing a measured voltage of one of the cells and an estimated voltage of the one of the cells from the model, and responsive to a difference between the measured voltage and the estimated voltage, updating parameters of a delta filter portion of the bar delta filter according to the difference.

11. The method of claim 10, wherein the estimated voltage depends on output of the bar filter portion.

12. The method of claim 8, wherein each of the cells has a corresponding delta filter portion associated therewith.

13. The method of claim 8, wherein the balancing current includes an average value that represents an average deviation of the estimated current through the cell from a total current of the string.

14. The method of claim 8, wherein the balancing current includes delta values that represent, for each of the cells, a deviation of the estimated current through the cell from a total current of the string.

15. An automotive control system comprising:
a controller programmed to charge or discharge a traction battery according to power limits at least partially defined by output indicative of a state of charge of the traction battery and updated by a bar delta filter according to a balancing current associated with each cell of a string of series connected cells of the traction battery and that represents a deviation of an estimated current through the cell from a total current of the string.

16. The automotive control system of claim 15, wherein each of the cells has a corresponding delta filter portion associated therewith.

17. The automotive control system of claim 15, wherein the balancing current includes an average value that represents an average deviation of the estimated current through the cell from a total current of the string.

18. The automotive control system of claim 15, wherein the balancing current includes delta values that represent, for each of the cells, a deviation of the estimated current through the cell from a total current of the string.

* * * * *